(12) United States Patent
Xue

(10) Patent No.: US 9,502,268 B2
(45) Date of Patent: Nov. 22, 2016

(54) METHOD AND STRUCTURE FOR WAFER LEVEL PACKAGING WITH LARGE CONTACT AREA

(71) Applicant: Alpha and Omega Semiconductor Incorporated, Sunnyvale, CA (US)

(72) Inventor: Yan Xun Xue, Los Gatos, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/933,302

(22) Filed: Nov. 5, 2015

(65) Prior Publication Data

US 2016/0064251 A1 Mar. 3, 2016

Related U.S. Application Data

(60) Division of application No. 14/097,433, filed on Dec. 5, 2013, now Pat. No. 9,224,669, which is a division of (Continued)

(51) Int. Cl.

| | |
|---|---|
| *H01L 21/332* | (2006.01) |
| *H01L 29/40* | (2006.01) |
| *H01L 21/48* | (2006.01) |
| *H01L 23/31* | (2006.01) |
| *H01L 21/78* | (2006.01) |

(Continued)

(52) U.S. Cl.
CPC ........... *H01L 21/486* (2013.01); *H01L 21/304* (2013.01); *H01L 21/4846* (2013.01); *H01L 21/4853* (2013.01); *H01L 21/561* (2013.01); *H01L 21/76898* (2013.01); *H01L 21/78* (2013.01); *H01L 23/3114* (2013.01); *H01L 23/481* (2013.01); *H01L 24/03* (2013.01); *H01L 24/06* (2013.01); *H01L 24/94* (2013.01); *H01L 24/96* (2013.01); *H01L 25/50* (2013.01); *H01L 24/05* (2013.01); *H01L 2224/034* (2013.01); *H01L 2224/0361* (2013.01); *H01L 2224/03622* (2013.01); *H01L 2224/0401* (2013.01); *H01L 2224/04105* (2013.01); *H01L 2224/05025* (2013.01); *H01L 2224/0603* (2013.01); *H01L 2224/06051* (2013.01); *H01L 2224/13111* (2013.01); *H01L 2224/94* (2013.01); *H01L 2224/96* (2013.01); *H01L 2924/12042* (2013.01); *H01L 2924/13091* (2013.01)

(58) Field of Classification Search
CPC ........... H01L 2224/94; H01L 2224/034; H01L 2224/0361; H01L 2224/13111; H01L 2224/96; H01L 2924/13091; H01L 23/3114; H01L 21/304; H01L 21/4846; H01L 21/76898; H01L 21/78; H01L 2224/0401; H01L 24/03; H01L 24/05; H01L 24/94
See application file for complete search history.

*Primary Examiner* — Su C Kim
*Assistant Examiner* — Junaiden Mirsalahuddin
(74) *Attorney, Agent, or Firm* — Chen-Chi Lin

(57) ABSTRACT

A method to provide a wafer level package with increasing contact pad area comprising the steps of forming a first packaging layer on wafer top surface, grinding the wafer back surface and etch through holes, depositing a metal to fill the through holes and covering wafer backside, cutting through the wafer from wafer backside forming a plurality of grooves separating each chip then depositing a second packaging layer filling the grooves and covering the wafer back metal, reducing the first packaging layer thickness to expose the second packaging layer filling the grooves and forming a plurality of contact pads overlaying the first packaging layer thereafter cutting through the second packaging layer in the grooves to form individual package.

6 Claims, 8 Drawing Sheets

Related U.S. Application Data application No. 13/429,263, filed on Mar. 23, 2012, now Pat. No. 8,710,648, which is a continuation-in-part of application No. 13/205,864, filed on Aug. 9, 2011, now Pat. No. 8,642,385.

(51) Int. Cl.
*H01L 23/00* (2006.01)
*H01L 23/48* (2006.01)
*H01L 21/768* (2006.01)
*H01L 21/304* (2006.01)
*H01L 21/56* (2006.01)
*H01L 25/00* (2006.01)

METHOD AND STRUCTURE FOR WAFER LEVEL PACKAGING WITH LARGE CONTACT AREA

CROSS-REFERENCE TO RELATED APPLICATIONS

This patent application is a Divisional application of a pending application Ser. No. 14/097,433. The pending application Ser. No. 14/097,433 is a Divisional application of a U.S. Pat. No. 8,710,648. Thus, this application claims the Priority Date of the U.S. Pat. No. 8,710,648. Also, the Disclosures made in the pending application Ser. No. 13/429,263 and the U.S. Pat. No. 8,710,648 are hereby incorporated by reference.

FIELD OF THE INVENTION

The invention generally relates to a wafer level packaging structure, particularly, to a wafer level packaging structure with a larger contact area and a preparation method thereof.

DESCRIPTION OF THE RELATED ART

Wafer level chip scale package (WLCSP) refers to the technology of packaging an integrated circuit (IC) at the wafer level, which comprises the following steps: after finishing the formation of semiconductor chips on a whole wafer, a packaging test is directly performed on the wafer and solder balls or solder bumps are formed; then single IC (Integrated Circuit) packages are singulated, where the resulting IC package is of the same size of the chip. The solder balls or solder bumps formed on wafer level chips are used as a contact terminal for electrically connecting the chip to an external circuit. It is well known that the power consumption of a power device is very high. Usually, the solder balls or the solder bumps are directly formed on a bonding pad of a Printed Circuit Board (PCB) and the volume of the solder balls or the solder bumps is small, thus the contact area of the solder balls or the solder bumps is limited, which results in high impedance and low thermal conductance effects. In addition, the chip is exposed because of lacking in physical protection, thus the chip is easily damaged in treatment and is highly vulnerable to moisture.

The US publication number 2009/0032871 discloses an integrated circuit including an active area, a first metal contact at a front surface of the active area and a second metal contact at a back surface of the active area, and a wafer-level deposited metal structure positioned adjacent to an edge of the active area for interconnecting the first and second metal contact. As shown in FIG. 1A, the semiconductor wafer 190 includes two semiconductor chips 200a and 200b that can be singulated through a groove 202'. Each of the chips 200a and 200b includes front side metal contacts 104a, 104b and 104c arranged on its front surface and a metal interconnection 110 located at the sidewall of the groove 202' and connected to the front side metal contact 104c. In FIG. 1B, thinned chips 151a, 151b and 151c are singulated. Each chip 151a, 151b and 151c includes front side metal contacts 104 arranged at the front surface of the active area and a backside metal contact arranged at the backside of the active area with the front side metal contact 104c connected to the backside metal contact 108 through the metal interconnection 110. The back side metal contact 108 forms an electrode at the bottom of the chip. Each chip 151a, 151b and 151c also includes packaging material 102 and a plurality of solder balls 152 formed on the front side metal contacts 104a, 104b and 104c, which are used for electrically connecting the chips 151a, 151b and 151c to the outside circuit. However, when the solder balls 152 are connected on the bonding pad on the PCB, the contact area between the solder balls 152 and the bonding pad on the PCB is very small, thus it is results in negative effects of high impedance and low thermal conduction when the chips 151a, 151b and 151c are applied in a power device.

BRIEF DESCRIPTION OF THE DRAWINGS

As shown in attached drawings, the embodiment of the invention is more sufficiently described. However, the attached drawings are only used for explaining and illustrating rather than limiting the scope of the invention.

DETAILED DESCRIPTION OF THE PREFERRED EMBODIMENTS

Figure 2A:
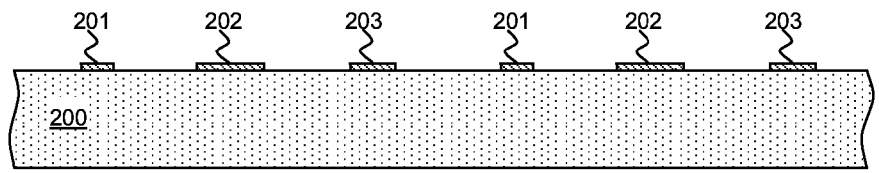
FIGS. 2A-2M are schematic diagrams illustrating a wafer level packaging manufacturing process according to a first embodiment of the present invention.

Referring to FIG. 2A, a wafer 200 generally includes a plurality of semiconductor chips with a scribe line used for defining the boundary between the adjacent chips (not shown), so that the individual chips can be singulated from the wafer 200 along the scribe line. It is well known in the art that, after finishing the manufacturing process of the wafer 200 to form the semiconductor chips, a plurality of first metal bonding pads 201 and 202 are formed at the front surface of wafer 200, particularly, at the front surface of each chip. The first metal bonding pads 201 and 202 can be aluminum silicon metal pad (I/O pad) pre-designed on the chip and are used as electrodes of the chips or terminals in signal transmission with the outside circuit.

Furthermore, a second metal bonding pad 203 is formed at the front surface of each chip, which can be made of metal materials such as aluminum-silicon alloy and the likes. For the sake of simplicity, a passivation layer for separating the first metal bonding pads 201 and 202 from the second metal bonding pad 203 is not shown in the figures. The first metal bonding pads 201 and 202 are electrically connected to the integrated circuit inside the chip, while the second metal bonding pad 203 is not electrically connected to the integrated circuit inside the chip.

Figure 2B:
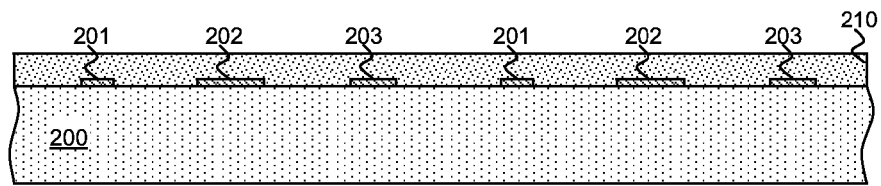
Figure 2C:
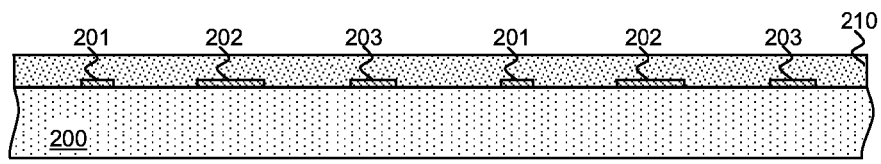
Figure 2D:
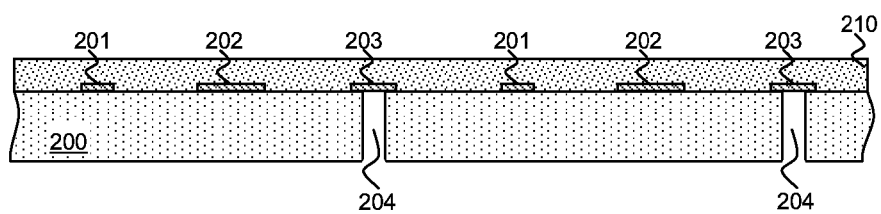

Referring to FIG. 2B, a first packaging layer 210 is formed to cover the front surface of wafer 200, the first metal bonding pads 201 and 202 and the second metal bonding pad 203. Then, the back surface of the wafer 200 is ground (for example, chemical mechanical polishing) to reduce its thickness, as shown in FIG. 2C. As the first packaging layer 210 can effectively physically support for the wafer 200, the thickness of wafer 200 can be thinned enough without being cracked, as such the thickness of the chip formed in the wafer 200 is also thinned. Optionally, after the wafer 200 is thinned, the back surface of the wafer 200 is heavily doped with ions. Then, the wafer 200 is etched from its back surface to form a bottom through hole 204, as shown in FIG. 2D. In particular, the bottom through hole 204 is formed in each chip formed in the wafer 200, in which, the second metal bonding pad 203 is in superimposition with the bottom through hole 204 with the bottom through hole 204 extending to the front surface of the chip exposing the second metal bonding pad 203. The existing TSV (Through Silicon Via) technology, dry etching, wet etching or laser etching is suitable for the etching step for forming the bottom through hole 204. It is generally required that the cross-sectional area of the bottom through hole 204 is smaller than the contact area of the second metal bonding pad 203. After the bottom through hole 204 is formed, an insulation layer (not shown), such as $SiO_2$ and the like, is deposited at the side wall of the bottom through hole 204. However, since the bottom through hole 204 occupies a certain space of the chip, the bottom through hole 204 is formed in a non-effective circuit area in order to minimize the possible negative effects, i.e., the bottom through hole 204 is not formed in an effective integrated circuit unit in the chip or the etched area is formed in a circuit blank area. As such, even the bottom through hole 204 is formed in the chip, there is no adverse effect on the original circuit of the chip.

Figure 2E:
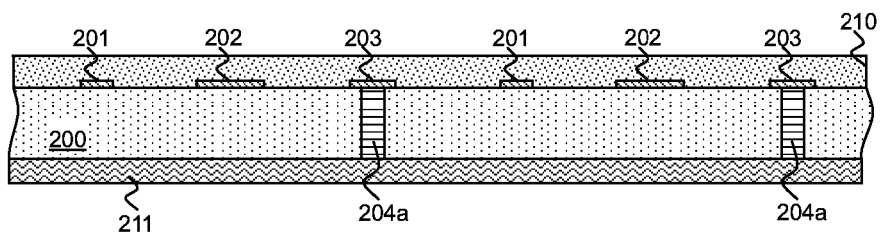

As shown in FIG. 2E, a conductive material is filled in the bottom through hole 204 forming a bottom metal interconnecting structure 204a connected to the second metal bonding pad 203. The bottom metal interconnecting structure 204a is electrically insulated from the conductive material of the chip surrounding the bottom through hole 204 through the insulation layer covering the side wall of the bottom through hole 204 as described above. Then, a metal layer 211 is deposited to cover the back surface of the wafer 200, which is electrically connected to the bottom metal interconnecting structure 204b. As such the metal layer 211 is electrically connected to the metal bonding pad 203 through the bottom metal interconnecting structure 204a.

Figure 2F:
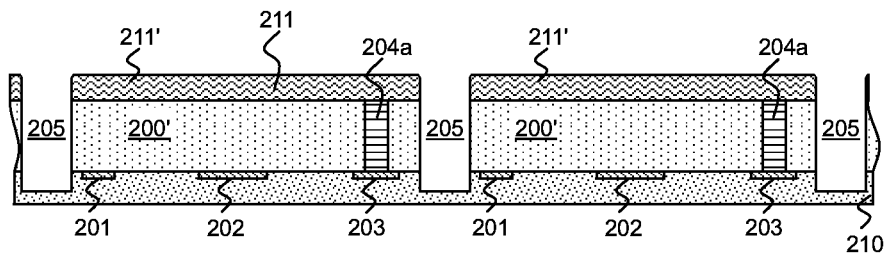

As shown in FIG. 2F, the wafer 200 and the metal layer 211 are cut from the back surface of the wafer 200 along the scribe line on the wafer 200 to form a plurality of cutting grooves 205 extending into the first packaging layer 210. As such, individual chips 200' formed in the wafer 200 are separated by the cutting grooves 205. At the same time, the metal layer 211 is cut into a plurality of bottom metal layers 211', each of which is formed at the back surface of each chip 200'. Thus, the bottom metal layer 211' is electrically connected to the second metal bonding pad 203 positioned at the front surface of the chip 200' through the bottom metal interconnecting structure 204a. The ions doped at the back surface of the wafer 200 or at the back surface of the chip 200' providing a good ohmic contact between the back surface of the chip 200' and the bottom metal layer 211'.

Figure 2G:
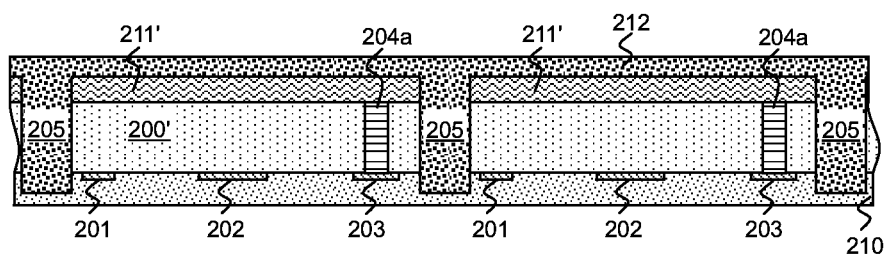
Figure 2H:
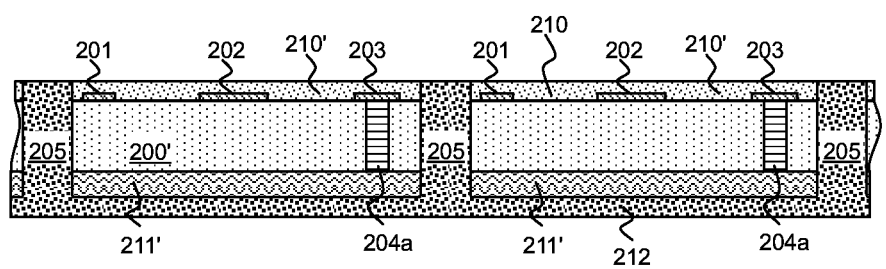

As shown in FIG. 2G, a packaging material is deposited to form a second packaging layer 212 to cover bottom metal layers 211' and to fill into the cutting groove 205 as well. As shown in FIG. 2H, the packaging body is preferred to be as thin and compact as possible, therefore the first packaging layer 210 is thinned until the packaging material 212 filled in the cutting groove 205 is exposed and a plurality of top packaging layers 210' are formed, each of which covers the front surface of each chip 200', with adjacent top packaging layers 210' separated by packaging material 212 filled in the cutting groove 205.

Figure 2I:
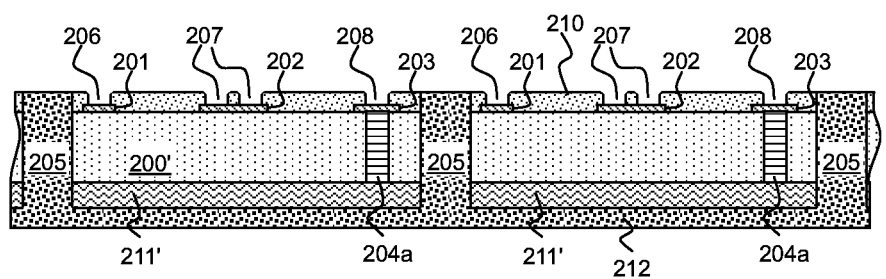
Figure 2J:
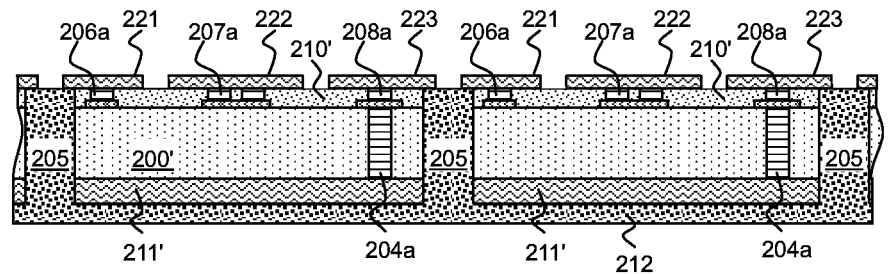

As shown in FIG. 2I, the top packaging layer 210' is etched (for example, laser etching) to expose the first metal bonding pads 201 and 202 and the second metal bonding pad 203, thus forming a plurality of top through holes 206, 207 and 208 at the first metal bonding pads 201 and 202 and the second metal bonding pad 203 respectively. In particular, the top through hole 206 is aligned with the first metal bonding pad 201, the top through hole 207 is aligned with the first metal bonding pad 202, and the top through hole 208 is aligned with the second metal bonding pad 203. As shown in FIG. 2J, the conductive material is filled into top through holes 206, 207 and 208 forming the top metal interconnecting structure 206a connected to the first metal bonding pad 201, a top metal interconnecting structure 207a connected to the first metal bonding pad 202 and a top metal interconnecting structure 208a connected to the second metal bonding pad 203. Hereafter, a plurality of contact bonding pads 221, 222 and 223 are formed on the top packaging layer 210' and are electrically connected to the first metal bonding pad 201, the first metal bonding pad 202 and the second metal bonding pad 203 respectively through the top metal interconnecting structure 206a, the top metal interconnecting structure 207a and the top metal interconnecting structure 208a respectively.

Figure 2K:
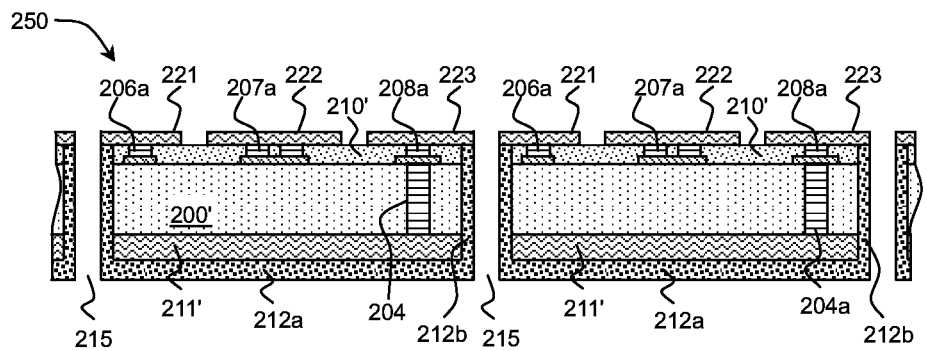

As shown in FIG. 2K, individual wafer level packaging structures 250 are separated from each other by cutting the second packaging layer 212 and the packaging material filled in the cutting groove 205 along the cutting groove 205 forming a cutting groove 215. If a width of the cutting groove 215 is narrower than that of the cutting groove 205, the remaining of the packaging material filled into the cutting groove 205, after being cut, forms a side packaging layer 212b covering the side surface of the chip 200'. Each wafer level packaging structure 250 includes the first metal bonding pads 201 and 202 and the second metal bonding pad 203 formed at the front surface of the chip 200', and a bottom metal layer 211' covering the back surface of the chip 200'. The second metal bonding pad 203 is positioned above a bottom through hole 204, which is extends from the front surface to the back surface of the chip 200', and is electrically connected to the bottom metal layer 211' through the bottom metal interconnecting structure 204a formed in the bottom through hole 204, which is electrically insulated from the conductive material of the chip 200' surrounding the bottom through hole 204 by the insulation layer (not shown) formed on the side wall of the bottom through hole 204. The wafer level packaging structure 250 further includes the top packaging layer 210' covering the front surface of the chip 200', the bottom packaging layer 212a covering the bottom metal layer 211' and a side packaging layer 212b covering the side surface of chip 200'. The wafer level packaging structure 250 further includes a plurality of contact bonding pads 221, 222 and 223 formed atop the top packaging layer 210', which are electrically connected to the first metal bonding pad 201, the first metal bonding pad 202 and the second metal bonding pad 203 through top metal interconnecting structures 206a, 207a and 208a respectively. The area of each contact bonding pad may be maximized by extending each contact bonding pad to the two adjacent edges of the top packaging layer 210' having an increased area larger than the corresponding top metal interconnecting structure and the first or second metal bonding pad.

In an embodiment mode, the chip 200' is a vertical power semiconductor device, for example, a vertical metal oxide semiconductor field effect transistor (MOSFET). In this case, the first metal bonding pad 201 is a gate electrode of the chip 200', the first metal bonding pad 202 is a source electrode of the chip 200' and a drain area of the MOSFET is formed at the back surface of the chip 200'. The drain electrode of the chip 200' is formed on the bottom metal layer 211', therefore the drain electrode of the chip 200' is electrically connected to the second metal bonding pad 203 positioned at the front surface of the chip 200' through the bottom metal interconnecting structure 204a as described above. The contact bonding pad 221 electrically connected with the first metal bonding pad 201 is functioned as an external gate terminal of the chip 200'. The contact bonding pad 222 electrically connected with the first metal bonding pad 202 is functioned as an external source terminal of the chip 200', and the contact bonding pad 223 electrically connected with the second metal bonding pad 203 is functioned as an external drain terminal of the chip 200'. The contact bonding pads 221, 222 and 223 can be directly connected to a bonding pad (generally plating tin on the surface) preset on the PCB. Larger size of contact bonding pads 221, 222 and 223 are, larger contact area of the contact bonding pads 221, 222 and 223 and the bonding pads on the PCB is achieved, thus the impedance and the thermal conduction effect is improved when the chip 200' is electrically connected with the external circuit. The top packaging layer 210', the bottom packaging layer 212a and the side packaging layer 212b of the chip 200' improve the mechanical strength of the chip 200' and protect the chip 200' from moisture or other adverse environmental factors. The wafer level package structure 250 of the present invention is very thin without using of any lead-frame, solder material (such as conductive silver paste and the like) as a binder for connecting the chip, and bonding wire that may cause negative high impedance effect for electrical connection.

The contact bonding pads 221, 222 and 223 may be formed by metal deposition on the top packaging layer 210' using a mask (not shown). Particularly, a metal layer may be firstly deposited on the top packaging layer 210'. The mask is applied atop of the metal layer, thus the metal layer is etched through the openings on the mask forming the contact bonding pads 221, 222 and 223. In addition, for two contact bonding pads positioned at the edge of the adjacent chips, for example as shown in FIG. 2J contact bonding pads 223 of a first chip 200' (left side of FIG. 2J) and contact bonding pad 221 of a second chip 200' (right side of FIG. 2J), contact bonding pads 223 and 221 may be formed by firstly forming one common bonding pad positioned above the cutting groove 205 filled with packaging material, then the contact bonding pad 223 and the contact boding pad 221 are separated when the packaging material filled in the cutting groove 205 and the second packaging layer 212 are cut through (FIG. 2K).

Figure 1A:
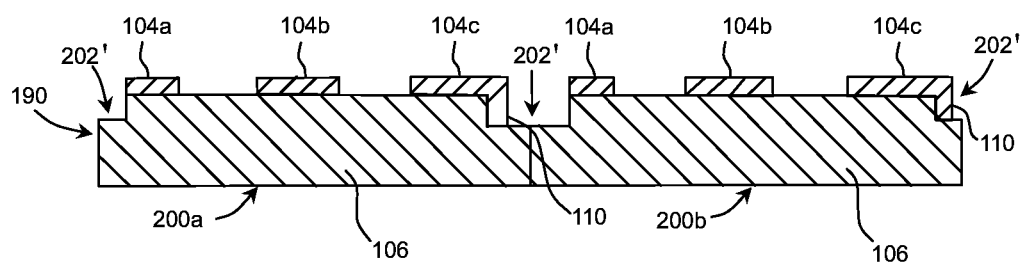
FIGS. 1A-1B are cross-sectional views of an integrated circuit of the prior art.
Figure 1B:
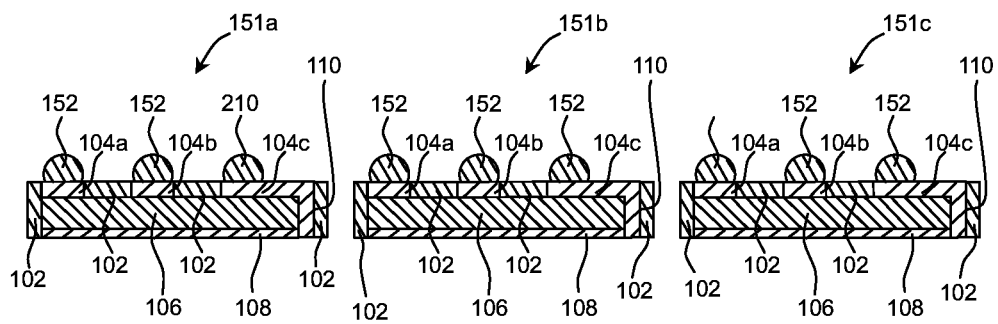
Figure 2L:
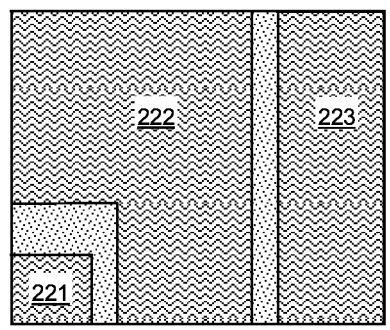
Figure 2M:
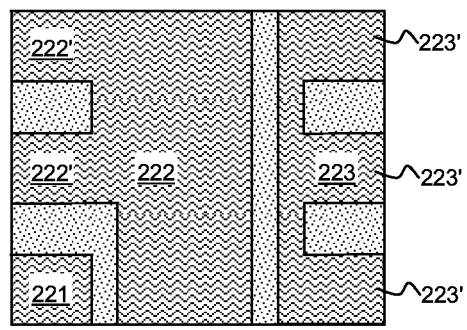

FIG. 2L is a top view of the wafer level packaging structure 250. Compared with the existing packaging structure (FIG. 1B), the contact area for electrically connecting to an external circuit of the solder ball 152 is small due to small volume of the solder ball 152, in the packaging structure 250 of the present invention, the contact bonding pads 221, 222 and 223 provides larger contact area for electrical connecting to the external circuit. The shape of the contact bonding pads 221, 222 and 223 can be selected depending on the application of the device; for example, as shown in FIG. 2M, the contact pads 222 and 223 can be shaped with a plurality of pins 222' and 223' respectively. Obviously, in the wafer level packaging structure 250 shown in FIG. 2M, the contact bonding pads 221, 222 and 223 with the pins 222' and 223' extending to the edge of the chip 200' can be compatible with traditional Quad Flat No-lead (QFN) Package, so that this packaging structure can be mounted on any PCB suitable for soldering the packaging body such as the QFN and the like through a surface mount technology (SMT).

Figure 3A:
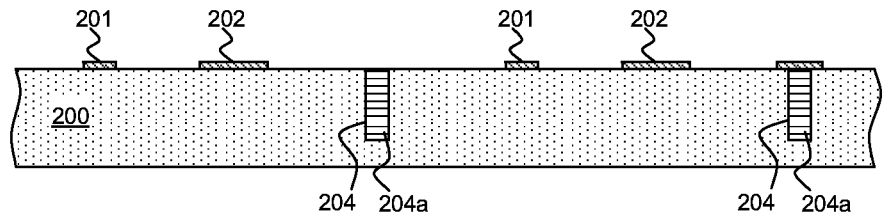
FIGS. 3A-3D are schematic diagrams illustrating a wafer level packaging manufacturing process according to a second embodiment of the present invention.
Figure 3B:
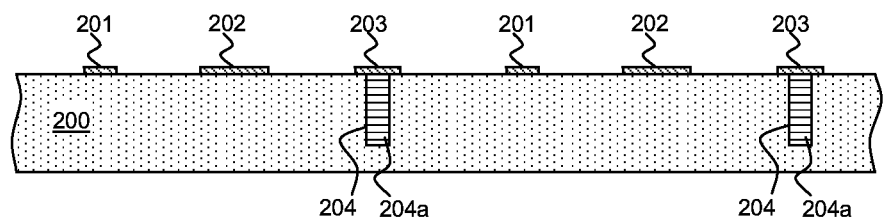
Figure 3C:
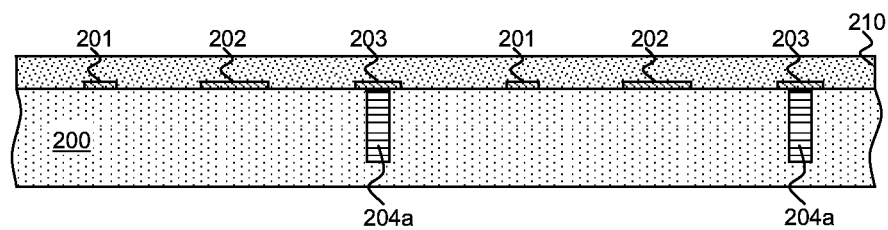
Figure 3D:
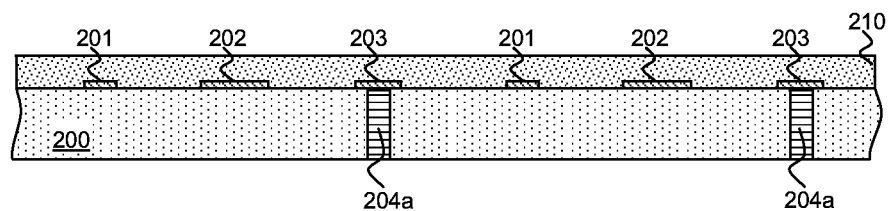

In another preferred embodiment, the packaging structure, as shown in FIG. 2E, can be obtained via the process as shown in FIGS. 3A-3D. In an initial state, a plurality of first metal bonding pads 201 and 202 are originally formed at the front surface of the chip formed in the wafer 200 as shown in FIG. 3A. Etching is carried out at the front surface of the chip to form a bottom through hole 204 in each chip formed in the wafer 200. The bottom through hole 204 extends downwards from the front surface of the chip to a certain depth but not penetrating through the whole thickness of the wafer 200. Then the bottom through hole 204 is filled with the conductive material forming the bottom metal interconnecting structure 204a. As mentioned above, the bottom through hole 204 is formed in a non-effective circuit preparing area of the chip. An insulation layer (for example $SiO_2$) (not shown) is deposited to cover the side wall of the bottom through hole 204 before filing the bottom through hole 204 with conductive material to form the bottom metal interconnecting structure 204a, as such the bottom metal interconnecting structure 204a is electrically insulated from the conductive material of the chip surrounding the bottom through hole 204 through the insulation layer. As shown in FIG. 3B, one second metal bonding pad 203 is formed at the front surface of the chip formed in the wafer 200, which is in superimposition and electrically connected to the bottom metal interconnecting structure 204a. As shown in FIG. 3C, the first packaging layer 210 is formed to cover the front surface of the wafer 200, the first metal bonding pads 201 and 202 and the second metal bonding pad 203. The wafer 200 is thinned by grinding from its back surface physically supporting by the first packaging layer 210 until the bottom metal interconnecting structure 204a is exposed at the back surface of the wafer 200 and the designed wafer thickness is obtained. The back surface of the thinned wafer 200 is then heavily doped with ions followed by the deposition of the metal layer 211 at the back surface of the wafer 200. The metal layer 211 is connected to the bottom metal interconnecting structure 204a (as shown in FIG. 2E). The complete wafer level package structure 250 is then formed with the steps described in FIGS. 2E-2M.

Figure 4A:
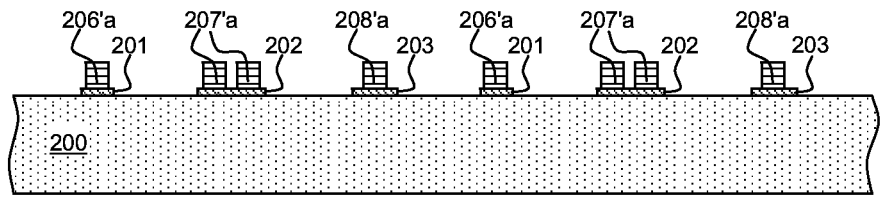
FIGS. 4A-4J are schematic diagrams illustrating a water level packaging manufacturing process according to a third embodiment of the present invention.
Figure 4B:
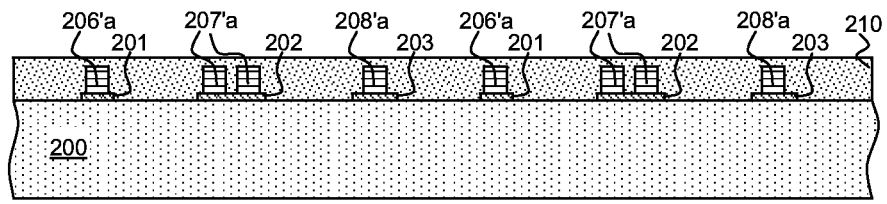
Figure 4C:
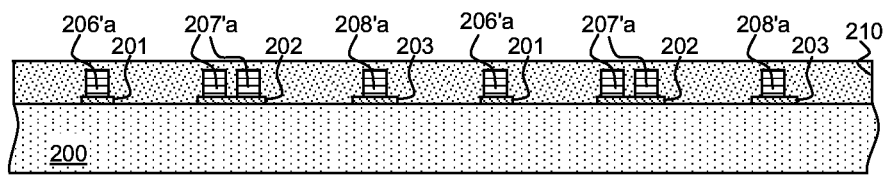
Figure 4D:
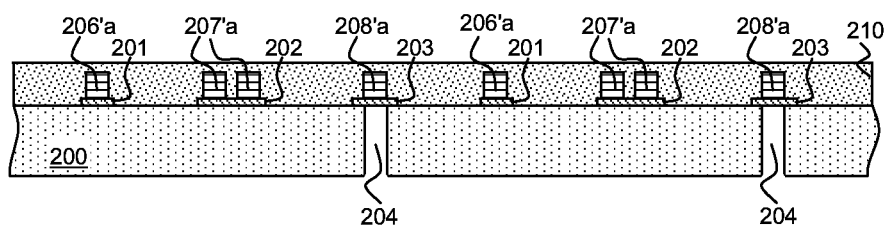
Figure 4E:
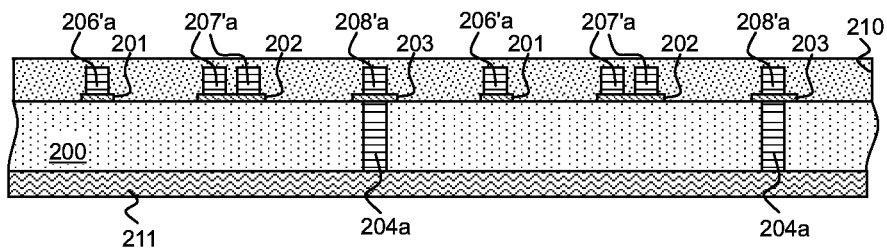
Figure 4F:
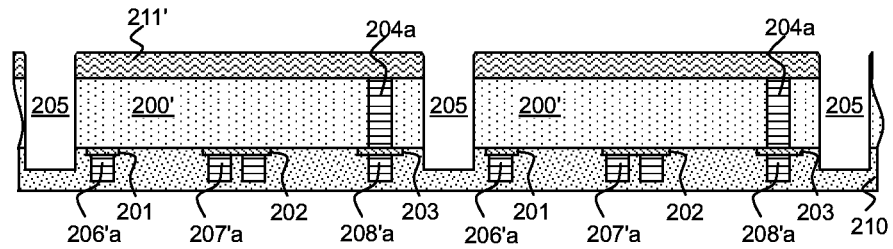

Another method for preparing wafer level packaging structures of the present invention is shown in FIGS. 4A-4J. In the initial state, a plurality of first metal bonding pads 201 and 202 are originally formed at the front surface of the chip formed in the wafer 200. In this embodiment, one second metal bonding pad 203 is form at the front surface of each chip. Then a plurality of top metal interconnecting structures 206'a, 207'a and 208'a are respectively formed on the first metal bonding pad 201, the first metal bonding pad 202 and the second metal bonding pad 203 correspondingly. The top metal interconnecting structures 206'a, 207'a and 208'a can be made of conductive materials such as solder balls or solder bumps and the likes. As shown in FIG. 4B, the first packaging layer 210 is formed to cover the front surface of the wafer 200, the first metal bonding pad 201, the first metal bonding pad 202, the second metal bonding pad 203 and the top metal interconnecting structures 206'a, 207'a and 208'a. As shown in FIG. 4C, the back surface of the wafer 200 is ground to reduce the thickness of the wafer 200. As shown in FIG. 4D, each chip of the thinned wafer 200 is etched from its back surface to form one bottom through hole 204 beneath the second metal bonding pad 203. After the bottom through hole 204 is formed, an insulation layer is deposited on the side wall of the bottom through hole 204. The bottom through hole 204 is then filled with the conductive material to form the metal interconnecting structure 204a. As mentioned above, the bottom through hole 204 is formed in the non-effective circuit preparing area of the chip. Thus, the bottom metal interconnecting structure 204a is connected to the second metal bonding pad 203. As shown in FIG. 4E, firstly, the back surface of the thinned wafer 200 is heavily doped with ions, then a metal layer 211 is deposited at the back surface of the wafer 200. As shown in FIG. 4F, the wafer 200 and the metal layer 211 are cut from the back surface, forming a plurality of cutting grooves 205. The depth of the cutting groove 205 can be varied, for example, the cutting grooves 205 can extend into the first packaging layer 210 as shown in FIG. 4F. As such, individual chips 200' formed in the wafer 200 are separated from each other by the cutting groove 205 and the metal layer 211 is also cut into a plurality of bottom metal layers 211', each of which is formed at the back surface of each chip 200'.

Figure 4G:
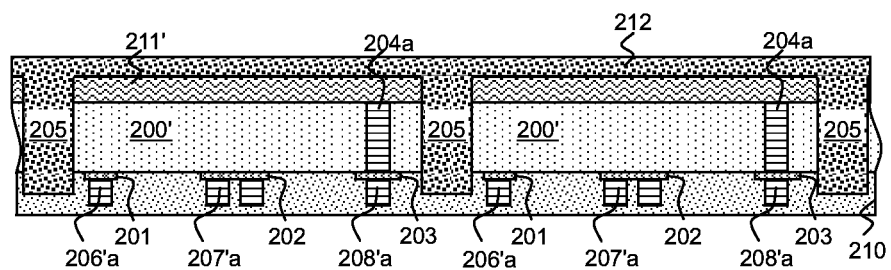
Figure 4H:
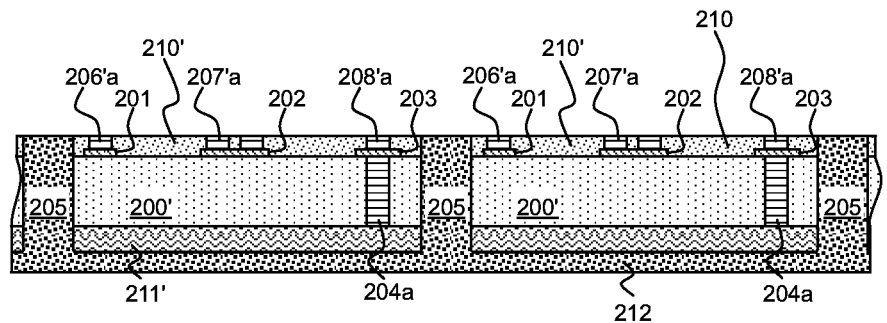
Figure 4I:
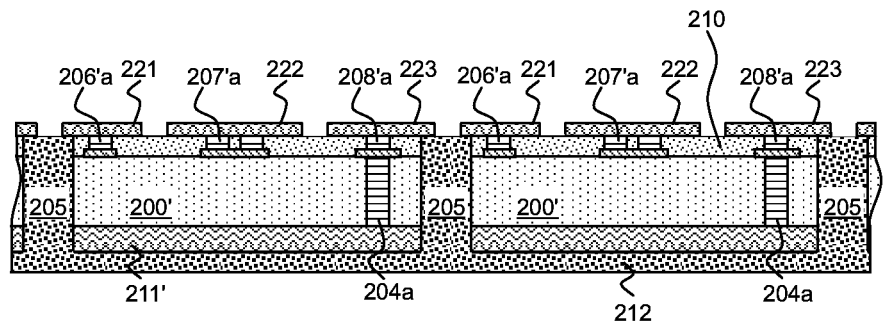
Figure 4J:
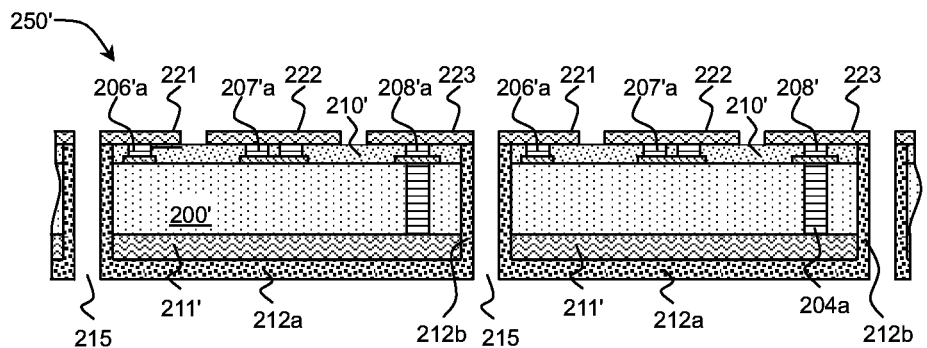

As shown in FIG. 4G, a packaging material is deposited to form a second packaging layer 212 at the back surface of the wafer 200 to cover bottom metal layers 211' and to fill into the cutting groove 205. As shown in FIG. 4H, the first packaging layer 210 is thinned until the packaging materials filled in the cutting groove 205 and the top metal interconnecting structures 206'a, 207'a and 208'a are exposed forming a plurality of top packaging layers 210' separated by the packaging materials filled in the cutting groove 205, with each of the top packaging layers 210' covering the front surface of each chip 200'. As shown in FIG. 4I, a plurality of contact bonding pads 221, 222 and 223 are formed atop the top packaging layer 210', each of which is electrically connected to one of first metal bonding pads 201 and 202 or one second metal bonding pad 203 correspondingly through one top metal interconnecting structure. As shown in the figure, the contact bonding pad 221 is formed on the top metal interconnecting structure 206'a and is electrically connected to the first metal bonding pad 201 through the top metal interconnecting structure 206'a. The contact bonding pad 222 is formed on the top metal interconnecting structure 207'a and is electrically connected to the first metal bonding pad 202 correspondingly through the top metal interconnecting structure 207'a. The contact bonding pad 223 is formed on the top metal interconnecting structure 208'a and is electrically connected to the second metal bonding pad 203 through the top metal interconnecting structure 208'a. As shown in FIG. 4J, the individual wafer level packaging structures 250' are separated from each other by cutting through the second packaging layer 212 and the packaging materials filled in the cutting groove 205 forming the cutting groove 215. As such, the second packaging layer 212 is cut into a plurality of the bottom plastic packaging layers 212a, each of which covers the bottom metal layer 211' of the package structure 250'. If the width of the cutting groove 215 is narrower than that of the cutting groove 205, the remaining of packaging materials filled in the cutting groove 205 forms the side packaging layer 212b covering the side of the chip 200'.

Figure 5A:
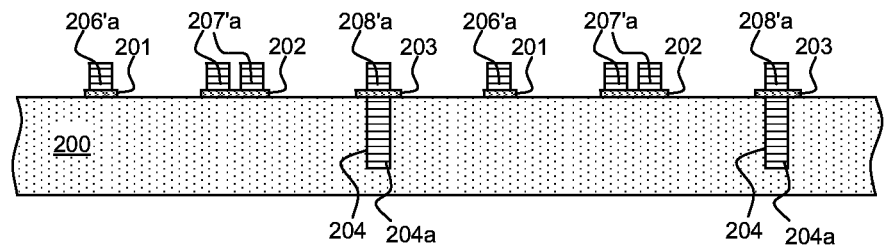
FIGS. 5A-5C are schematic diagrams illustrating a wafer level packaging manufacturing process according to a fourth embodiment of the present invention.
Figure 5B:
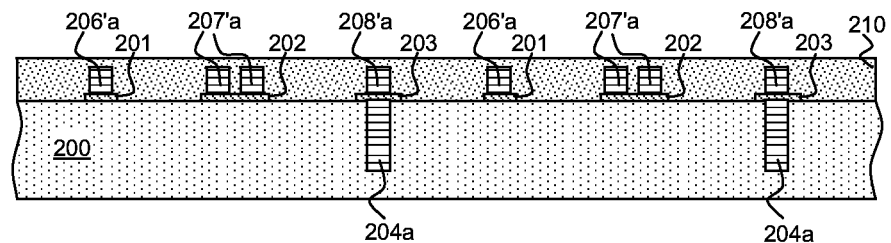
Figure 5C:
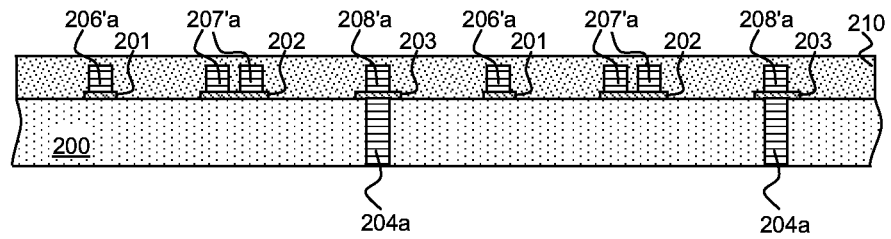

In another embodiment, as shown in FIGS. 5A-5C, the process is started with the structure as shown in FIG. 3B. Then, as shown in FIG. 5A, the top metal interconnecting structures 206'a, 207'a and 208'a is formed on the first metal bonding pad 201, the first metal bonding pad 202 and the second metal bonding pad 203. The top metal interconnecting structure 206'a, 207'a and 208'a can be made of solder tin balls or metal bumps or other materials. As shown in FIG. 5B, the first packaging layer 210 is formed to cover the front surface of the wafer 200, the first s metal bonding pads 201 and 202, the second metal bonding pad 203 and the top metal interconnecting structure 206'a, 207'a and 208'a. As shown in FIG. 5C, the back surface of the wafer 200 is ground until the bottom metal interconnecting structure 204a is exposed at the back surface of the wafer 200 and the predetermined thickness of the wafer is obtained. The back surface of the thinned wafer 200 is then heavily doped with ions followed by the formation of a metal layer 211 covering the back surface of the wafer 200. As such, the metal layer 211 is connected to the bottom metal interconnecting structure 204a. The structure of FIG. 5C is equivalent with the structure of FIG. 4E before forming the bottom metal layer 211. The complete wafer level package structure 250' is then formed with the steps described in FIGS. 4E-4J.

Hereinbefore, through descriptions and drawings, the typical embodiments of the specific structures of the specific embodiment modes are provided, and the existing preferable embodiments are provided in the invention, however, these contents are not used as the limit. For the technical personnel of the field, all changes and amendments are undoubtedly obvious after reading the above specification. Consequently, the attached claims should be regarded as all changes and amendments covering the real intention and the scope of the invention. In the scope of the claims, any and all equivalent scopes and contents should be considered still belonging to the intention and the scope of the invention.

The invention claimed is:

1. A method for preparing a wafer level packaging structure with a large contact area, wherein a plurality of first metal bonding pads are formed at front surfaces of semiconductor chips formed in a semiconductor wafer, the method comprising the following steps of:

etching a respective front surface of each semiconductor chip to form at least a respective bottom through hole with a depth shorter than a thickness of the semiconductor wafer and filling a conductive material in the respective bottom through hole to form a respective bottom metal interconnecting structure;

forming a respective second metal bonding pad at the respective front surface of each semiconductor chip and above the respective bottom metal interconnecting structure, the respective second metal bonding pad being electrically connected to the respective bottom metal interconnecting structure;

forming a first packaging layer covering the plurality of first metal bonding pads and the second metal bonding pads and a front surface of the semiconductor wafer;

grinding at a back surface of the semiconductor wafer until the bottom metal interconnecting structures are exposed from the back surface of the semiconductor wafer;

forming a metal layer covering the back surface of the semiconductor wafer, the metal layer being connected to the bottom metal interconnecting structures;

cutting through the semiconductor wafer and the metal layer from the back surface of the semiconductor wafer to form a plurality of cutting grooves, wherein the plurality of cutting grooves extend into the first packaging layer and separate individual semiconductor chips from each other, wherein the metal layer is cut into a plurality of bottom metal layers, and wherein a respective bottom metal layer of the plurality of bottom metal layers covers a back surface of each semiconductor chip;

depositing a packaging material to form a second packaging layer covering the plurality of bottom metal layers and to filling into the plurality of cutting grooves;

grinding at the first packaging layer until the packaging material filled in the plurality of cutting grooves is exposed, wherein the first packaging layer is cut into a plurality of top packaging layers, and wherein a respective top packaging layer of the plurality of top packaging layers covers the front surface of each semiconductor chip;

etching the plurality of top packaging layers to expose the plurality of first metal bonding pads and the second metal bonding pads so as to form a plurality of top through holes above the plurality of first metal bonding pads and the second metal bonding pads, and filling another conductive material into the plurality of top through holes to form a plurality of top metal interconnecting structures, the plurality of top metal interconnecting structures being connected to the plurality of first metal bonding pads and the second metal bonding pads;

forming a plurality of contact bonding pads atop the plurality of top packaging layers, wherein each contact bonding pad is electrically connected to one first metal bonding pad of the plurality of first metal bonding pads or one second metal bonding pad of the second metal bonding pads through at least one top metal interconnecting structure of the plurality of top metal interconnecting structures; and cutting through the second packaging layer and the packaging material filled in the plurality of cutting grooves along the plurality of cutting grooves to separate individual wafer level packaging structures from each other, wherein the second packaging layer is cut into a plurality of bottom packaging layers, and wherein a respective bottom packaging layer of the plurality of bottom packaging layers covers the bottom metal layer of each semiconductor chip.

2. The method of claim 1, wherein after the bottom through hole is formed, an insulation layer is deposited to cover a side wall of the bottom through hole before filing the conductive material into the bottom through hole to form the bottom metal interconnecting structure, and wherein the bottom metal interconnecting structure is electrically insulated from the conductive material of the semiconductor chip surrounding the bottom through hole through the insulation layer.

3. The method of claim 1, wherein the back surface of the semiconductor wafer is heavily doped with ions before the metal layer is formed at the back surface of the semiconductor wafer.

4. The method of claim 1, wherein the bottom through hole is formed in a non-effective circuit preparing area of the semiconductor chip.

5. The method of claim 1, wherein the semiconductor chip is a MOSFET (Metal Oxide Semiconductor Field Effect Transistor), wherein the plurality of first metal bonding pads comprise gate electrodes and source electrodes, and wherein drain electrodes are formed at the plurality of bottom metal layers.

6. The method of claim 1, wherein a remaining of the packaging material filled in the plurality of cutting grooves, after cutting through the second packaging layer and the packaging material filled in the plurality of cutting grooves along the plurality of cutting grooves, form side packaging layers covering sides of the semiconductor chips.

* * * * *